United States Patent [19]

Buchanan et al.

[11] Patent Number: 4,963,425
[45] Date of Patent: Oct. 16, 1990

[54] PRINTED WIRING BOARD SUBSTRATE FOR SURFACE MOUNTED COMPONENTS

[75] Inventors: Alan M. Buchanan, Midvale; Jay S. Abramowitz, Salt Lake City; Roberta A. Y. Flygare, Salt Lake City, all of Utah

[73] Assignee: Unisys Corporation, Blue Bell, Pa.

[21] Appl. No.: 708,588

[22] Filed: Mar. 5, 1985

[51] Int. Cl.$^5$ .......................... H05K 1/03; B32B 7/02
[52] U.S. Cl. .................... 428/212; 174/250; 428/209; 428/210; 428/323; 428/328; 428/704; 428/901
[58] Field of Search ............... 428/209, 210, 212, 328, 428/901, 131, 137, 323, 704

[56] References Cited

U.S. PATENT DOCUMENTS

| | | | |
|---|---|---|---|
| 4,294,877 | 10/1981 | Graham | 428/209 |
| 4,299,873 | 11/1981 | Ogihara et al. | 428/137 |
| 4,318,954 | 3/1982 | Jensen | 428/212 X |
| 4,429,216 | 1/1984 | Brigham | 428/901 X |
| 4,452,847 | 6/1984 | Siemon | 428/901 X |
| 4,492,730 | 1/1985 | Oishi et al. | 428/901 X |
| 4,513,055 | 4/1985 | Leibowitz | 428/901 X |
| 4,522,667 | 6/1985 | Hanson et al. | 428/901 X |
| 4,526,835 | 7/1985 | Takahashi et al. | 428/901 X |

*Primary Examiner*—Ellis P. Robinson
*Attorney, Agent, or Firm*—Donald G. Weber; Glenn W. Bowen; Robert S. Bramson

[57] ABSTRACT

A laminated printed wiring board having surfaces thereof fabricated from conventional fiber reinforced laminates which are secured together by means of an adhesive fabricated of a reinforced thermosetting resin having a coefficient of thermal expansion (CTE) which is substantially smaller than the CTE of the surface laminate whereby the apparent CTE of the overall printed wiring board assembly is substantially controlled.

20 Claims, 1 Drawing Sheet

PRINTED WIRING BOARD SUBSTRATE FOR SURFACE MOUNTED COMPONENTS

BACKGROUND OF THE INVENTION

1. Field of the Invention

This invention relates to printed wiring board assemblies having a controlled, relatively low, coefficient of thermal expansion, in general, and to such printed wiring board assemblies which are useful for the surface mounting of ceramic chip carriers, in particular.

2. Prior Art

Printed wiring boards are well known in the electronics industry for, inter alia, supporting electronic components. Many printed wiring boards are of the type wherein components are mounted on the board by insertion of leads into through-holes in the printed wiring board. However, it has been observed that this type of structure or packaging provides relatively low packaging density.

Inamsuch as it is highly desirable to obtain high density packaging in the same size or to produce circuit assemblies with significant reductions in physical size and/or weight, other types of packaging are utilized. This type of packaging is frequently referred to as surface-mounting of components. In some studies it has been shown that a 75% reduction in the required area of the circuit board can be achieved with surface mounting of components. Obviously, an additional 50% reduction of surface area can be achieved if both sides of the printed circuit board are utilized. (It is clear that this type of mounting is not feasible with conventional through-hole mounting arrangements.)

Other advantages in the utilization of surface mounted components is the reduction in lead lengths as well as the improvement in uniformity of such leads. By this improvement, other undesirable characteristics such as parasitic capacitance, inductance, and resistance in the lead lines is reduced.

Also, ceramic chip carriers show advantageous characteristics in terms of hermeticity, reliability, low cost, testability and burn-in prior to installation of the component on the board.

However, the major difficulty with surface mounted components is, in addition to the inspection difficulty (i.e. the component is mounted over the junction with the board), the problem of the coefficient of thermal expansion (CTE) mismatch which occurs as a result of the different thermal expansion rates of the component and the PC board. That is, most printed circuit or printed wiring boards have a relatively high coefficient of thermal expansion while surface mounted devices fabricated of a ceramic material, have a relatively low CTE. Typically, the circuit board CTE is about 8 PPM/°F. while the ceramic chip carriers have a CTE of approximately 4 PPM/°F. With these significant differences in the CTE, continuous thermal cycling causes fatigue and other problems such as breakage in the junctions or the like.

Consequently, it is highly desirable to produce a printed wiring board which has a coefficient of thermal expansion which is the same as or similar to the CTE of the surface mounted components.

Obviously, the circuit boards could be made of a material such as ceramic or the like to effect this compatibility. However, ceramic circuit boards are both heavy and expensive, as well as difficult to work with or the like. Also, such ceramic boards may be fragile and easily broken.

One solution to the CTE mismatch problem has been described in the prior art and is shown and described in U.S. Pat. No. 4,318,954 to W. M. Jensen and entitled PRINTED WIRING BOARD SUBSTRATES FOR CERAMIC CHIP CARRIERS. However, this approach has the undesirable characteristics of requiring that a support member in the form of a slab of a filament-reinforced thermosetting resin is disposed adjacent to or between printed wiring boards. The printed wiring boards are electrically insulated from said support member. This non-conductive layer significanly reduces heat transfer within the printed wiring board which will add to a heat removal problem already magnified by increased packaging density, or conversely, prevent the desired result of increased packaging density. With this approach, the CTE problem can be overcome but the laying up of the support member, the adhesive layers and the printed circuit boards can become a significant problem in terms of the fabrication cost and processing of circuit boards of this type.

In addition, the additional expense of producing the support member/slab can become a significant consideration when forming these boards. This additional cost is not, generally, overcome by the other advantages of this type of board.

Other approaches to this problem are described in an article entitled "Kevlar as the Reinforcing Fiber in Printed Wiring Board Materials," by Carl T. Brooks, in *PCFAB*, February 1982, pages 32–36, especially pages 34 and 36. Also, this problem is discussed in the IEEE TRANSACTIONS ON COMPONENTS, HYBRIDS AND MANUFACTURING TECHNOLOGY, Vol. CHMT-2, No. 1, March, 1979 in a paper entitled "Low Expansive Organic Substrate for Flip-Chip Bonding" by S. E. Greer, pages 140–144. Each of these publications describes the use of Kevlar, a product of E. I. DuPont de Nemours & Company as a suitable material for use in laminates used in the preparation of circuit boards which are to be used for mounting ceramic chips thereon. These publications especially describe the use of Kevlar laminates in lieu of alumina or other similar material as the printed circuit board base component.

In an attempt to eliminate the CTE mismatch problem which has significantly slowed the implementation of ceramic leadless chip carriers, numerous alternative approaches have been explored. These approaches include, inter alia, the use of elastomerics, leaded carriers, sockets, ceramic substrates, metallic supports, fiberous reinforcement and numerous resins. The approaches have been tried individually and in combination. However, most of these approaches suffer from shortcomings which cause the respective approaches to be undesirable in this particular area. For example, the elastomeric devices suffer from production problems with no overriding advantages over the other alternatives. Leaded carriers are expensive, difficult to handle and generally require additional PC board "real estate". The use of sockets negates the size, weight, cost and production advantages to be obtained through surface mounting techniques. Ceramic substrates provide excellent CTE matching but cost and processing requirements are very restrictive. Metallic supports such as Invar, Kovar and Alloy 42 include weight and cost penalties. Such units fabricated of titanium, molybdenum and porcelainized steel are not cost effective. The use of advanced fibers is considered to be one of the more promising approaches. Such fibers include aramid, quartz, graphite, boron (and variations on all of these). Also, blended weaves of two or more of these fiber types have been found desirable. Various resins have been explored in conjunction with all of the above.

Thus, it is clear that a significant amount of time, energy and expense have been utilized in extensive research over a number of years in order to permit the use of surface mounting techniques especially in the case of ceramic leadless chip carriers in order to obtain the advantages thereof. However, none of the existing devices has proved to be completely satisfactory. Moreover, most of the research to date has led to very sophisticated, highly complicated solutions. Consequently, further investigation is under way and has spawned the instant invention.

SUMMARY OF THE INSTANT INVENTION

This invention is directed to a laminated, printed wiring board wherein the two major surfaces of the laminated board are fabricated from conventional fiber-reinforced plastic laminates, such as fiber-reinforced epoxy laminates. The two laminates may include an electrically conductive ground plane on one surface thereof, if so desired. One surface of each of the laminates, in particular the ground plane surface if present, is secured by means of a suitable adhesive which is fabricated from reinforced thermosetting resin which has a coefficient of thermal expansion (CTE) which is selected to restrain or constrain the expansion of the plastic laminates adhered thereto. The laminates, typically, have a CTE which is significantly greater than the CTE of the adhesive. Through the use of this adhesive, the CTE of the laminate is constrained to an acceptable level in the X-Y plane. The CTE in the Z plane is substantially unaffected.

By varying the thickness construction and the thermal conductivity of the adhesive layer, specific circuit board constructions are available.

DESCRIPTION OF THE PREFERRED EMBODIMENT

Figure 1:
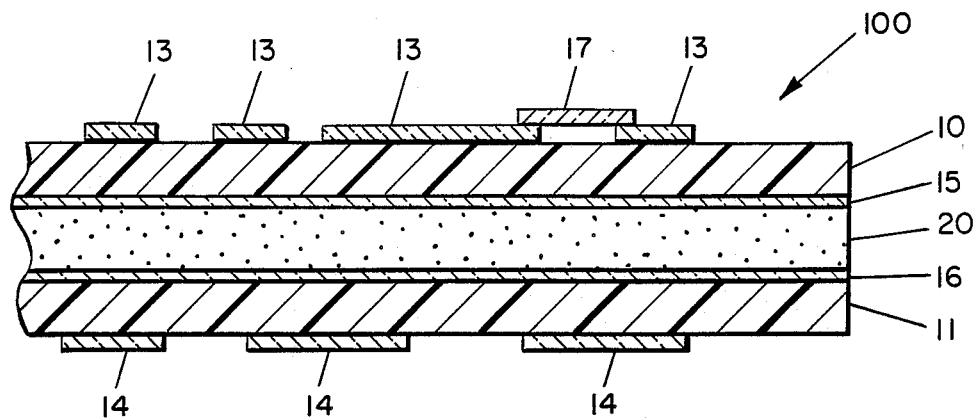
FIGS. 1 and 2 are schematic representations of cross-sectional views of different embodiments of the instant invention.

Referring now to FIG. 1, there is shown a laminated printed wiring board 100 which is fabricated in accordance with the teaching of this invention. In this instance, the layers 10 and 11 are conventional, glass-fiber reinforced, thermosetting resin printed wiring boards. Each of these boards may contain several electrically-active signal path layers 13 and 14 on the external surfaces. In addition, each of these boards may include an electrically conductive layer 15 and 16 on the respective opposite surfaces thereof to form the ground planes for each of the respective boards. The respective boards 10 and 11 may be in the nature of multi-layer board construction. A surface mounted chip device 17 is shown attached to the conductive paths 13.

Layer 20 interposed between layers 10 and 11 is, in accordance with this invention, an adhesive layer formed of a material which is characterized by a cured coefficient of thermal expansion which is less than two microinches/inch/°F. In one embodiment, layer 20 is fabricated of a non-conductive material. Typically, this adhesive layer may include an aramid, quartz or other fiber reinforcement included in a thermosetting resin.

In typical fabrication technique, the circuit boards 10 and 11 are fabricated in the usual fashion. The adhesive layer 20 can be applied to the surfaces of layers 10 and 11 in the usual lay-up process. Conversely, the boards 10 and 11 need not be fully cured prior to lamination but may be cured as part of an assembly process. The curing process, which is typical in the prior art is determined by the resin system used. Standard PC board resins (such as may be found in boards 10 and 11 in FIG. 1) are 350° F. epoxy systems with approximately 25% flow, gel times of 2–4 minutes, and low volatiles (less than 1%). The typical cure cycle consists of one hour in a hot press at 350° F. and 300 psi plate pressure.

With the apparatus of this invention, there is provided a highly desirable and highly advantageous printed wiring board which has the desirable characteristic that the laminated board does not expand at a rate which is incompatible with the expansion of the ceramic chip carriers 17 which are surface mounted thereon. Thus, the problems of this mismatch of CTE is avoided. Moreover, this type of board can be fabricated using existing production tools and methods.

In an alternative embodiment, the same construction shown in FIG. 1 can be modified by causing adhesive layer 20 to be impregnated with layers, fibers or other forms of conductive material such as graphite, boron or the like. By using this type of material, the entire layer 20 becomes a conductive adhesive layer. This layer has the same CTE characteristics as the layer described above and, in addition, functions as a conductive layer. Thus, a common ground plane can be achieved for each of the boards 10 and 11. This ground plane can be provided solely by the conductive adhesive layer 20 or in conjunction with the ground plane layers 15 and 16 described above.

Figure 2:
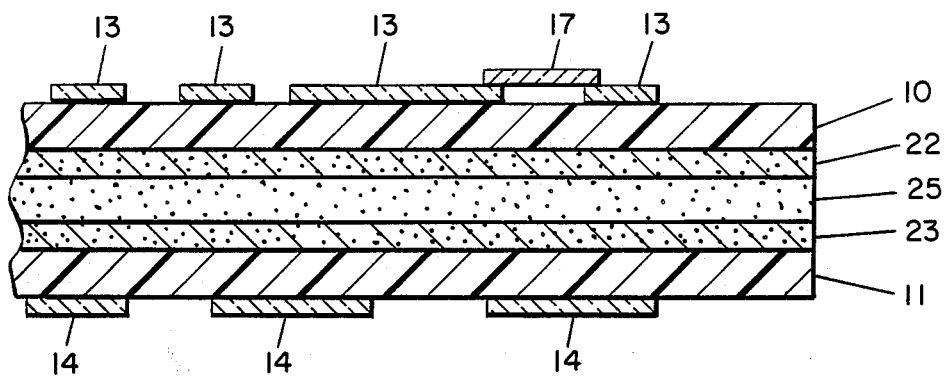

Referring now to FIG. 2, there is shown an alternative embodiment of the instant invention. In the embodiment shown in FIG. 2, the layers 10 and 11 comprise conventional, glass-fiber reinforced, thermosetting-resin printed wiring boards similar to the PWB's described relative to FIG. 1.

In like fashion, the adhesive layers 22 and 23 are similar to adhesive layer 20 described relative to FIG. 1. In particular, layers 22 and 23 are, in this embodiment, defined to be conductive, adhesive layers which may consist of one or more layers of graphite, boron or other similar fibers pre-impregnated with a thermosetting resin.

In the embodiment shown in FIG. 2, layer 25 comprises a layer of non-conductive material which exhibits a cured coefficient of thermal expansion which is less than the appropriate CTE. Again, in this case, the CTE characteristic of layer 25 is less than 2 microinches-/inch/°F. Also, this layer may, typically, consist of an aramid, quartz, or any other similar fiber reinforced thermoset resin. Again, the circuit boards 10 and 11 and, as well, the thermoset resin of layer 25 can either be fully cured (or not) prior to the time of lamination.

The embodiment shown in FIG. 2 has the same advantages as the embodiment shown in FIG. 1 relative to the elimination of CTE mismatch. However, by inserting the non-conductive layer 25, a thermal and electrical insulation between the circuit boards 10 and 11 (and the related circuitry and components) is effected.

In another embodiment of the instant invention, layer 25 can be formed of a conductive material by using a typical composition of cured graphite, boron or other fiber reinforced thermosetting resin. Thus, the adhesive layer is thermally and electrically conductive with the first and second printed wiring boards which is a very important advantage. For example, this embodiment offers design and process advantages, such as providing a "thermal pipeline" for heat removal. Thus, the "thermal pipeline" is made of an extremely high-conductivity, low-CTE, graphite-fiber-reinforced support layer while minimizing waste and breakage of the extremely expensive and brittle material in a cured state.

In another embodiment of the instant invention, layer 25 can be fabricated of a non-conductive layer, such as a glass fiber reinforced thermosetting resin. Glass fiber reinforcement is required in many high-humidity, high-reliability applications where a non-conductive layer is needed but the hydroscopic nature of aramid fibers and a well-documented resin-cracking phenomenon associated with such use cannot be tolerated.

Thus, there is shown and described a new technique for providing laminated printed wiring boards using known techniques and processes to produce a laminated board which has a cured coefficient of thermal expansion which is constrained and/or restrained so as to approximate and be compatible with the CTE of a ceramic chip carrier. However, the apparatus of the instant invention does not require the utilization of a separate slab of support material which is, typically, difficult to produce, provides added expense, weight and size to printed wiring boards. While materials having suggested characteristics, CTE's, and specific illustrations and examples of such materials are provided, it is expected that those skilled in the art will be able to contemplate and/or derive modifications to the described invention. For example, by altering the thickness of the adhesive, the CTE can be altered. However, so long as the modifications fall within the purview of this description, these modifications are intended to be included therein as well. This description, including the examples, is intended to be illustrative only and is not intended to be limitative. Rather, the scope of the invention is limited only by the claims appended hereto.

We claim:

1. A composite circuit board structure comprising,
first and second printed wiring boards fabricated of a generally electrically non-conductive material adapted to receive and support thereon at least one component having a coefficient of thermal expansion which is less than the coefficient of thermal expansion of said printed wiring boards, and
a thermoset adhesive layer disposed between and adhered to each of said first and second printed wiring boards,
said adhesive layer having a coefficient of thermal expansion which is less than the coefficient of thermal expansion of said component and capable of restraining the expansion rate of said first and second printed wiring boards whereby the apparent coefficient of thermal expansion of the composite circuit board structure approaches that of each said component.

2. The structure recited in claim 1 wherein,
said adhesive layer is impregnated with conductive material wherein said adhesive exhibits thermal and electrical conductivity.

3. The structure recited in claim 1 wherein,
said adhesive layer is impregnated with conductive material wherein said adhesive layer exhibits thermal and electrical conductivity continuous with at least portions of said first and second printed wiring boards.

4. The structure recited in claim 1 including,
a layer of conductive material disposed intermediate said adhesive layer.

5. The structure recited in claim 1 including,
a layer of non-conductive material disposed intermediate to said adhesive layer.

6. The structure recited in claim 1 wherein,
said adhesive layer comprises a non-conductive material.

7. The structure recited in claim 3 wherein,
at least one of said first and second printed wiring boards includes a conductive layer which is contiguous with said adhesive layer.

8. The structure recited in claim 6 wherein,
said non-conductive material comprises an aramid, fused silica, quartz, or similar fiber reinforced thermosetting resin.

9. The structure recited in claim 3 wherein,
said conductive material comprises graphite, boron or the like.

10. The structure recited in claim 1 wherein,
said wiring boards are fabricated of a glass-fiber reinforced, thermosetting resin.

11. The structure recited in claim 1 wherein,
said wiring boards comprise multilayer printed circuit boards.

12. The structure recited in claim 1 wherein,
said boards are fully cured when said adhesive layer is disposed therebetween.

13. The structure recited in claim 1 wherein,
said wiring boards have a coefficient of thermal expansion of greater than 2.0 microinch/inch°F., and said adhesive layer has a cured coefficient of thermal expansion of less than 2.0 microinch/inch°F.

14. The structure recited in claim 5 wherein,
said layer of non conductive material has a cured coefficient of thermal expansion of greater than 2.0 microinch/inch°F.

15. The structure recited in claim 1 including,
printed wiring conductors disposed on the outer surface of at least one of said first and second printed wiring boards and adapted for connection to said component.

16. The structure recited in claim 1 wherein,
said component is a ceramic chip carrier.

17. The structure recited in claim 16 wherein,
said ceramic chip carrier and said composite structure have substantially the same coefficient of thermal expansion.

18. The structure recited in claim 2 wherein,
said adhesive layer forms a thermally conductive layer which operates as a heat sink.

19. The structure recited in claim 2 wherein,
said adhesive layer produces a ground plane for said printed wiring boards.

20. The structure recited in claim 6 wherein,
said adhesive layer produces a power plane for the composite structure.

* * * * *